United States Patent [19]

Youngs et al.

[11] Patent Number: 4,606,790

[45] Date of Patent: Aug. 19, 1986

[54] CONDUCTIVE PAPER AND METHOD

[75] Inventors: Roger W. Youngs, Hinsdale, Ill.;
Robert W. Lewis, Saratoga, Calif.;
Robert N. Kussman, Tacoma; John
R. Hurtt, Puyallup, both of Wash.

[73] Assignee: Container Corporation of America, Chicago, Ill.

[21] Appl. No.: 628,513

[22] Filed: Jul. 6, 1984

[51] Int. Cl.$^4$ ............................................. D21H 1/02
[52] U.S. Cl. ................................... 162/125; 162/128; 162/138; 162/158; 162/168.1; 162/168.2; 162/181.9
[58] Field of Search ............... 162/125, 128, 132, 133, 162/138, 181.9, 181.5, 168.1, 168.2, 158

[56] References Cited

U.S. PATENT DOCUMENTS

| | | | |
|---|---|---|---|
| 3,048,515 | 8/1962 | Dalton | 162/128 |
| 3,149,023 | 9/1964 | Bodendorf et al. | 162/138 |
| 3,265,557 | 8/1966 | DeFries et al. | 162/138 |
| 4,160,503 | 7/1979 | Ohlbach | 206/328 |
| 4,211,324 | 7/1980 | Ohlbach | 206/328 |
| 4,293,070 | 10/1981 | Ohlbach | 206/328 |

FOREIGN PATENT DOCUMENTS

| | | | |
|---|---|---|---|
| 45-27527 | 9/1970 | Japan | 162/138 |
| 56-26097 | 3/1981 | Japan | 162/138 |
| 961636 | 6/1964 | United Kingdom | 162/181.9 |

OTHER PUBLICATIONS

"NALCO 8674", Product Bulletin, 1982.
"NALCO 623-SC", Product Bulletin, 1981.
"NALCO 7654-SC", Product Bulletin, 1982.

Primary Examiner—Peter Chin
Attorney, Agent, or Firm—Richard W. Carpenter

[57] ABSTRACT

A multi-ply, fibrous material-based, conductive structure, and a method of making such a structure, which comprises as an integral structural member thereof at least one ply having an integral, continuous, uninterrupted, electroconductive barrier capable of intercepting and dissipating any electrostatic charges or discharges coming into contact with the structure. The ply provided with the electroconductive barrier can, during manufacture, be preselectively positioned with relation to the other, non-conductive plies comprising the structure to meet the specific performance demands of a user of the structure.

13 Claims, 7 Drawing Figures

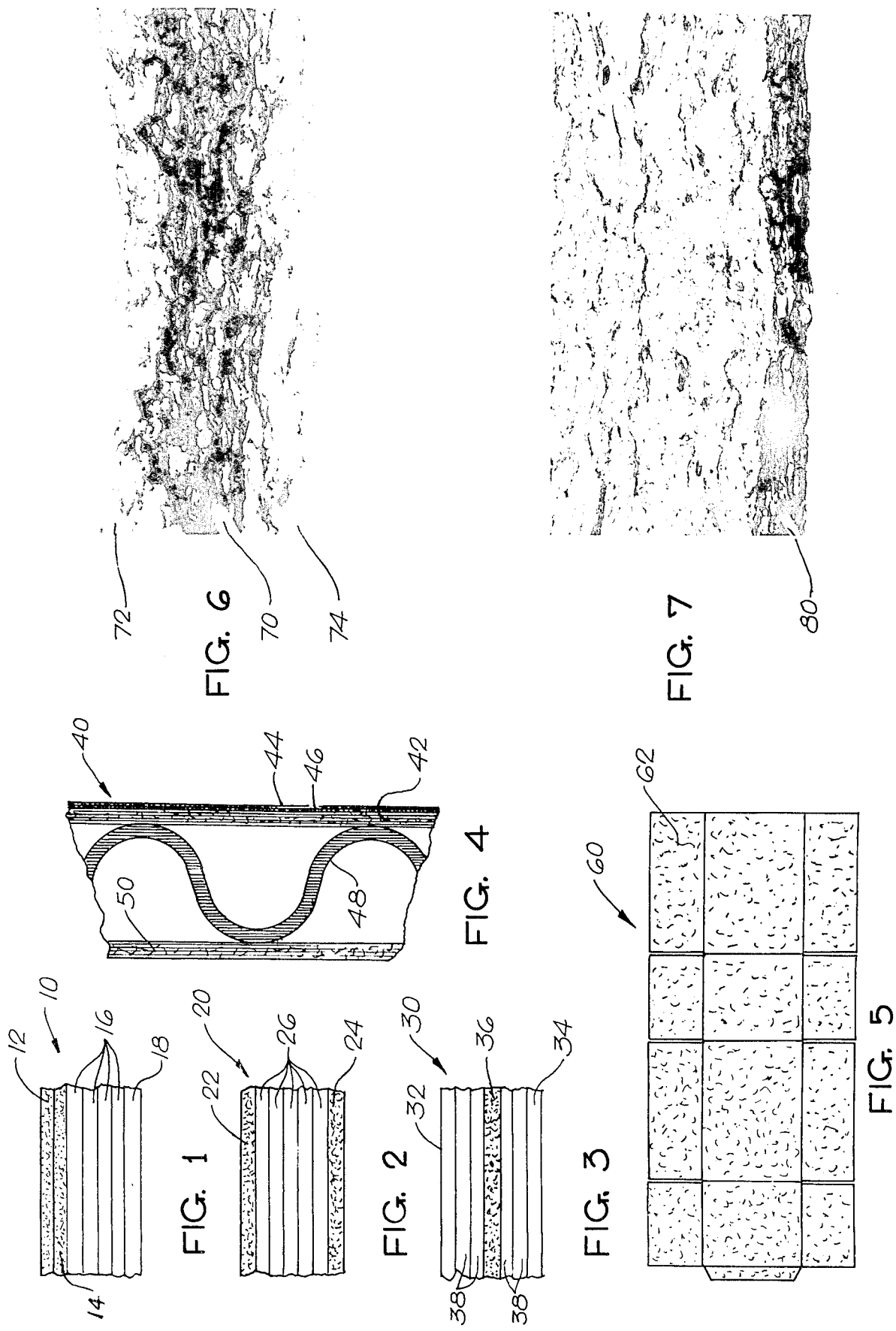

CONDUCTIVE PAPER AND METHOD

TECHNICAL FIELD

The present invention relates to conductive paper and paperboard, and to a method of making same, for dissipating electrical charges, especially electrostatic charges.

BACKGROUND OF THE PRIOR ART

The manufacture of conductive papers has received widespread attention over the years. Thus, for example, B. B. Gutman, a Russian, published an article entitled "Electroconductive Paper", in Bumazhnaya Promyshlennost' 31, No. 6: 12–15 (1956), wherein he reported on his investigations into the use of various materials to improve the electroconductivity of paper. His investigations showed that carbon black or graphite, when introduced into paper as a filler, imparted satisfactory electroconductivity to the paper. Gutman's work also revealed that with an increase in the number of electroconductive plies in a sheet of paper, the electrical resistance of the paper is increased while the mechanical retention of the conductive particles is weakened. The papers used in the investigations of Gutman were prepared from unbleached sulfate pulp using a beater.

In U.S. Pat. No. 3,149,023 there is disclosed a graphite containing fibrous sheet material having electrically conductive properties. The sheet material is prepared by a multi-step process which includes admixing graphite particles with fibers of papermaking length in water to provide a homogeneous slurry. The slurry is then fed to the headbox of a paper making machine into which is fed simultaneously therewith a solution of a cationic agent, in particular, an amine-modified starch, so that the two feeds intermix but a very short time before the fibers and graphite particles deposit upon the wire of the papermaking machine to form the initial electrically conductive sheet material. The graphite particles employed in the process of the patent are less than 200 mesh and preferably less than 300 mesh, and the end product comprises 30–75 percent graphite particles by weight. According to the teaching of the patent, the cationic agent used is believed to develop a strong positive charge on the graphite particles in the aqueous slurry with the fibers, and that the graphite particles then flock and are attracted to the surface of the fibers which acts as if negatively charged. Following preparation of the initial or base conductive sheet material the sheet material is dried, and then impregnated or saturated in a dispersion of graphite particles in a resin such as chlorinated natural rubber. The excess dispersion medium is removed, and the thusly impregnated sheet material is dried. The dried sheet material thereafter is subjected to a supercalendering operation wherein the sheet is compacted and the graphite particles crushed to form the finished sheet material.

In U.S. Pat. No. 3,265,557 there is disclosed a process for making electrically conductive products comprising a mixture of electrically conductive carbon fibers and natural or synthetic non-conductive fibers. The process is carried out by dispersing the carbon fibers in a liquid slurry, and agitating the slurry to disperse the carbon fibers in the form of individual filaments. The non-conductive fibers are then added to the slurry, and the resulting mixture is felted. The semi-dried sheets are dried in a press under pressure. According to the patent, a plurality of the separately formed sheets can be fused together at elevated temperatures to form a single sheet.

Other patents directed to electrically conductive products, and processes for manufacturing them, include U.S. Pat. Nos. 4,160,503, 4,211,324 and 4,290,070. Each of the patents is directed to containers for dissipating electrostatic charges which may damage the micro circuitry of printed circuit boards. The containers disclosed in the patents are formed from finished paperboard, a surface of which is coated with conductive carbon black particles contained in a printing ink vehicle. In order to provide an effective coating of conductive carbon black on the surface of the paperboard, it is necessary, in practice, to apply at least two coatings of the carbon black-printing ink dispersion on a single surface of the paperboard which, of course, increases production time, and adds to the overall cost of the end product.

BRIEF SUMMARY OF THE INVENTION

In accordance with the present invention, an electrically conductive, multi-ply paperboard structure has been evolved which comprises one or more plies impregnated with, and embodying as an integral component thereof an electrically conductive substance. The ply, or plies, of the structure incorporating the conductive substance are preselectively positionable with relation to one another, and with relation to the non-conductive plies of the structure, to provide optimum protection against electrostatic charges and discharges which may cause damage to electrostatic sensitive articles packaged in containers fabricated of the paperboard structure. The electrically conductive ply, or plies, comprising the structure can be selectively positioned in the structure in a continuous, in-line, high speed paperboard manufacturing operation utilizing standard equipment. As a result, the conductive paperboard structure of the present invention is characterized not only by its unique versatility from the standpoint of its ability to be fabricated in a manner to meet the packaging requirements of substantially any electrostatic sensitive article, but, also, by its ability to be produced at a cost significantly below the cost of making conventional conductive paperboard products which require special materials, as well as time consuming and costly multi-step processing procedures. It is also important to note that the mechanical strength properties, that is, the tensile, folding and bursting strength, of the structure are of the highest order, thereby enabling the structure, itself, to be formed into a container, or to be used as a component of corrugated paperboard, for example, for forming containers of any desired dimensions.

BRIEF DESCRIPTION OF THE DRAWINGS

FIG. 1 is an enlarged schematic vertical sectional view of an embodiment of the conductive paperboard structure of the present invention showing two plies, impregnated with or embodying a conductive substance, positioned on the inner side of the structure;

FIG. 2 is a view corresponding to the view of FIG. 1 showing the plies embodying the conductive substance positioned on the inner side and outer side of the structure;

FIG. 3 is a view corresponding to the view of FIG. 1 showing a single conductive substance carrying ply positioned in the center of the structure;

FIG. 4 is an enlarged schematic vertical sectional view of a section of corrugated paperboard incorporating an embodiment of the structure of this invention as the inner wall of the board;

FIG. 5 is a plan view of a box blank formed from the multi-ply structure of this invention; and FIGS. 6 and 7 are photomicrographs of conductive plies of the structure of the present invention.

DETAILED DESCRIPTION OF THE INVENTION

The starting material, or furnish, employed in making the electrically conductive ply, or plies, of the conductive multi-ply paperboard structure of the present invention comprises, as essential ingredients, fiber or pulp, an electrically conductive particulate substance, and an electroconductive polymer dispersant. A retention aid polymer, which functions as a flocculant, advantageously is incorporated into the furnish prior to sheet formation.

The fiber or pulp desirably is derived from waste paper of the type utilized in the manufacture of conventional chipboard. Included among such materials are corrugated kraft cuttings, or clippings, newsprint, kraft wrapping paper, virgin pulp, and the like, and mixtures thereof. The fiber or pulp is the major component of the furnish, comprising, generally speaking, about 60% to about 90%, preferably about 70% to about 85% by weight of the total weight of the furnish.

The electrically conductive particulate substance employed in making the conductive paperboard structure of this invention can be selected from various non-metallic and metallic particles. Exemplary of such substances are carbon black, graphite, powdered aluminum, powdered copper, powdered iron and iron oxide, powdered lead, and compatible mixtures of the foregoing. The generally optimum objectives of the invention are attained with conductive carbon black particles. Especially preferred conductive carbon black products are those available commercially under the trade designations "Black Pearls 2000" and XC-72R" (Cabot Corporation).

The particle size of the electrically conductive particulate substance should be such that the particles are amenable to ready, and substantially complete, dispersibility in an aqueous slurry formed from the furnish. To this end, the conductive particles advantageously should have a mesh size in the range of about 200 to about 350, preferably about 250 to about 325. The quantity of the electrically conductive particulate substance employed in formulating the furnish used in making the conductive ply, or plies, of the structure is somewhat variable. Generally speaking, however, the amount of the particulate substance used should be about 5% to about 25%, preferably about 8% to about 12%, by weight of the fiber or pulp comprising the furnish.

The electroconductive polymer dispersant component of the furnish serves to disperse the particles of the conductive particulate substance when the furnish is formed into an aqueous slurry. The dispersant also acts to provide an electrical charge on the surface of the particles of the conductive particulate substance which causes the particles to migrate toward the fibers comprising the pulp and to form small, dense, tightly compacted nodules of the particles on the surface of the fibers. It is noteworthy in this regard that the charge imparted by the polymer dispersant to the particles of the conductive particulate substance has an unique synergistic effect in that it increases, enhances and augments the electrical conductive properties of the particles in the finished product.

The electroconductive polymer dispersant used in the practice of this invention advantageously is a low or moderate molecular weight cationic or anionic water soluble polymer. Exemplary of polymers useful for the purposes of the present invention are cationic polymers such as diaminopolyacrylate, diaminopolymethacrylate, diaminopolyethylmethacrylate and the like. Specific examples of anionic polymers which can be used are lignosulfonate, sodium lignosulfonate, sodium polyacrylate, sodium polymethacrylate, and the like. Commercially available polymer dispersants which can be used include the cationic electroconductive resin sold under the designation "Nalco 8674" (Nalco Chemical Company).

The molecular weight of the polymer dispersant will range from about 5000 to about 30,000, usually from about 10,000 to about 12,000. The quantity of the dispersant used in formulating the furnish for making the conductive ply or plies of the structure should be about 5% to about 20%, preferably about 8% to about 12%, by weight of the conductive particulate substance comprising the furnish.

The retention aid polymer which, as stated above, performs the function of a flocculant when incorporated into an aqueous slurry formed with the furnish, can be cationic or anionic in character. Specific examples of cationic polymers useful as flocculants are polyacrylamide, polymethacrylamide, polyethylacrylamide, polybutylacrylamide, and the like. Exemplary of anionic retention aid polymers are polyacrylate, sodium polyacrylate, sodium polymethacrylate, and the like. Commercially available polymers of this type include the cationic acrylamide copolymer sold under the trade designation "Nalco 7654-SC" (Nalco Chemical Corporation), and the anionic high molecular weight polymer sold under the trade designation "Nalco 623-SC" (Nalco Chemical Corporation). The amount of the retention aid polymer used will be of the order of about 0.1% to about 1.5%, usually about 0.5% to about 1% by weight of the fiber/conductive particulate substance mixture.

Since the retention aid polymer functions in a manner opposite to that of the dispersant polymer, the retention aid polymer is added to an aqueous slurry comprising the furnish, that is, the pulp, the conductive particulate substance, and the dispersant polymer, only after the particles of the conductive particulate substance have been adsorbed or taken up by the fibers comprising the pulp, and, preferably, at a point removed from that at which the furnish was originally formed into a slurry. More specifically in this connection, the function of the retention aid polymer is to agglomerate, or bring together, the conductive particulate substance carrying fibers so that when a sheet, which ultimately constitutes one of the plies of the structure, is formed from the fibers, the particles of the conductive particulate substance will provide a continuous, uninterrupted, substantially uniform, highly conductive path for any electrostatic charges or discharges encountered by the structure.

As stated hereinabove, the multi-ply, conductive structure of this invention is fabricated by means of standard paperboard making equipment. Accordingly, the furnish for forming the conductive ply, or plies, of the structure, as well as the furnishes for forming the bottom liner or ply of the structure and the filler plies advantageously are first formed into aqueous slurries in standard pulpers which may range in capacity from 6000 to 10,000 gallons. By way of illustration, in accordance with a preferred practice of the invention, a pulper which is to be used to form an aqueous slurry from the furnish for making a conductive ply of the structure is filled with water to approximately one third to one half of its capacity. The conductive polymer dispersant is then added followed by the conductive particulate substance. The resultant mixture is slurried for a short time, after which the pulp and the balance of the water are added to the pulper. The slurry desirably is heated to a temperature of about 120° F. to about 170° F. while in the pulper. After approximately 15 to 45 minutes, the slurry is pumped from the pulper to a stock chest. After leaving the stock chest, and before entering the vats of a standard high speed cylinder machine, the retention aid is fed into the slurry. The cylinder machine comprises a wire section on which the sheet or ply is formed, and also is provided with a press section where the sheet or ply is pressed to remove water, and a drier section. The cylinder machine used to form the conductive ply of the structure, and the cylinder machines used to form the other sheets or plies of the multi-ply structure, are associated with a calender stack where the structure is finished. In those instances where the conductive ply, or plies, of the structure comprises the top layer or liner of the structure, a film or coating of an abrasion or rub-resistant plastics material advantageously is applied to the outer surface of the conductive ply. Various film forming plastic materials can be used for this purpose. Exemplary of a commercially available product which can be used is a water based emulsion of polyvinyl alcohol sold under the designation "WW-2049" (H. B. Fuller Company). The film or coating desirably is applied to the conductive ply as the structure is moving through the calender stack. To this end, the solution containing the film forming material is placed in one or more head boxes positioned on the stack. The film need only be 1 or 2 mils in thickness. Generally speaking, in utilizing a film forming material such as WW-2049, a satisfactory film can be formed with loadings in the range of about 0.5 to about 2, preferably about 1 pound of the film former to approximately 1000 square feet of sheet material.

Referring, now, to the drawings, FIGS. 1 to 3 illustrate the unique aspect of the present invention of being able to selectively position the conductive ply, or plies, of the multi-ply conductive structure in any desired position with relation to each other, and the other, non-conductive plies comprising the structure. Thus, as shown in FIG. 1, the structure, designated generally by reference numeral 10, comprises seven plies including two conductive plies 12 and 14 positioned on the inner side of the structure with relation to the non-conductive filler plies 16 and the non-conductive bottom ply or liner 18. In FIG. 2, the structure 20 has a conductive ply 22 and a conductive ply 24 on the outer surfaces thereof, with the non-conductive filler plies 26 sandwiched in between. FIG. 3 illustrates yet another embodiment of the structure. As shown, the structure 30 comprises a non-conductive top ply 32, a non-conductive bottom ply 34, and a conductive ply 36 positioned intermediate non-conductive filler plies 38. It should be understood, of course, that the embodiments of the conductive structure of this invention shown in FIGS. 1–3 are merely illustrative, and that the number and location of the conductive plies which comprise the structure may be altered, as desired, to meet the specific needs of manufacturers of articles which may be subject to damage by electrostatic charges or discharges. In this connection, it should be mentioned that the structures of the present invention can be manufactured to provide resistivities ranging from about 2500 upwards to about 100,000 Ohms, or more. The structures are capable of dissipating electrical charges in excess of 50,000 volts per square inch.

Referring, again, to the drawings, FIG. 4 shows an embodiment of the structure of this invention being used as the inner facing or web of a corrugated paperboard sheet 40. The structure, designated by reference numeral 42, corresponds to the embodiment of the structure 10 shown in FIG. 1 in that the innermost plies 44 and 46 are the conductive plies of the structure 42. The flute 48 and outer web 50 of the sheet 40 may be fabricated of conventional paperboard or also of conductive paperboard similar to the innerfacing.

In FIG. 5, an embodiment of a box blank made from the structure of this invention is shown. The blank, designated by reference numeral 60, has the conductive plies 62 facing inwardly so that they will be in close proximity to the articles packaged in a box formed from the blank 60 Box blanks may also be formed from single or laminated webs of conductive paperboard, i.e., folding cartons.

FIGS. 6 and 7 are reproductions of photomicrographs showing conductive carbon black particles embodied in the fibrous network of one of the plies of a structure made in accordance with the practice of the present invention. In FIG. 6, the carbon black containing ply or layer, designated by reference numeral 70, is located intermediate nonconductive filler plies 72 and 74 of the structure. In FIG. 7, the carbon black containing ply or layer 80 comprises the bottom ply or layer of the structure. The photomicrographs clearly show the substantially uniform, continuous, uninterrupted barrier and pathway provided by the carbon black particles for intercepting and dissipating electrostatic charges and discharges.

The following example illustrates the fabrication of an embodiment of the multi-ply conductive structure of the present invention.

EXAMPLE

To a standard 6000 gallon pulper, 2000 gallons of tap water are added. Approximately 24 pounds (2.5 gallons) of an electroconductive cationic dispersant polymer (Nalco 8674) are added to the water in the pulper followed by 212.5 pounds of conductive carbon black particles (Vulcan XC-72). The mixture is stirred for about 15 minutes at a temperature of about 120° F. A pulp, comprising approximately 1200 pounds of shredded corrugated kraft and 300 pounds of shredded newsprint are added to the pulper along with approximately 4000 gallons of tap water. The resulting slurry is heated to a temperature of approximately 150° F. and retained in the pulper for about 30 minutes. At the same time, pulp slurries are formed in other pulpers for use in making the non-conductive bottom ply and the non-conductive filler plies of the structure. The pulp in each case comprises approximately 1200 pounds of shredded corrugated kraft and 300 pounds of shredded newsprint.

The slurry containing the carbon black particles is conveyed to a stock chest. After leaving the stock chest and before entering the cylinder vats approximately 6 pounds/ton of a flocculant (Nalco 623 SC) is added into the slurry. The carbon black infused slurry, along with the slurries from the other pulpers are then fed into standard cylinder machines in accordance with conventional paper board manufacturing procedure. The cylinder machines are arranged so that the top two plies of the finished structure will comprise plies embodying the conductive carbon black particles. The machines are set to operate at a speed of approximately 400 feet per minute, and the drying temperature is about 300° F. The resulting multi-ply conductive structure is then conveyed to a calender stack equipped with two head boxes positioned in vertically spaced relation to one another and each containing a solution of a rub-resistant polymer (WW-2049) which is applied to the outer surface of the top, carbon black embodying ply of the structure to provide a coating or film approximate 1 mil in thickness thereon.

The surface resistivity of the finished structure is measured and is found to be approximately 5000 ohms. The structure has excellent mechanical strength.

What is claimed is:

1. A continuous, in-line method of preparing an electrically conductive, multi-ply structure for intercepting and dissipating electrostatic charges and discharges, said structure having at least one electrically conductive ply, and a plurality of non-conductive plies, and having sufficient mechanical strength to enable it to be formed into a container, or to be used as a component of a container, for packaging electrostatic sensitive articles to protect them against electrostatic charges and discharges, comprising: forming in a mixing vessel at least one aqueous slurry consisting essentially of a fibrous material, particles of an inorganic electrically conductive substance, said electrically conductive particles being present in an amount of at least about 5% based upon the weight of the fibrous material in said at least one aqueous slurry and an electroconductive polymer dispersant for the particles of the conductive substance said electroconductive polymer dispersant having a molecular weight of between about 500 and about 30,000, said electroconductive polymer being present in an amount of at least about 5% based upon the weight of said electroconductive particles; dispersing said particles in said mixing vessel in the presence of said fibrous material and the polymer dispersant to enable said particles to be substantially uniformly taken up by said fixedly supported on the fibers comprising the fibrous material; forming a plurality of separate aqueous slurries consisting essentially of a non-conductive fibrous material, transporting the slurry containing the particles of the conductive substance from said mixing vessel to a paper forming machine; adding a retention aid polymer to the slurry containing the particles of the conductive substance in an amount sufficient to agglomerate and compact said conductive particle supporting fibers; forming with the paper forming machine at least one ply in sheet form from said at least one slurry while said conductive particle supporting fibers are in an agglomerated and compacted condition to provide at least one conductive ply having as an integral part thereof a substantially continuous, uninterrupted, electrostatic charge intercepting barrier comprising fibers having particles of the electrically conductive substance fixedly supported thereon; forming separate, non-conductive plies in sheet form from said plurality of separate aqueous slurries consisting essentially of a non-conductive fibrous material; and combining said at least one conductive ply with said non-conductive plies to provide an integrated, multi-ply structure comprising a plurality of non-conductive plies, and at least one conductive ply, said at least one conductive ply being preselectively positioned with relation to the non-conductive plies of the structure to enable it to provide optimum protection against electrostatic charges and discharges, said structure having sufficient mechanical strength to enable it to be formed into a container, or to be used as a component of a container, for packaging electrostatic sensitive articles to be protected against electrostatic charges and discharges.

2. A method according to claim 1 wherein the electrically conductive substance is conductive carbon black or graphite.

3. A method according to claim 1 wherein the electrically conductive substance is powdered aluminum, powdered iron, powdered iron oxide, powdered lead, or powdered copper.

4. A method according to claim 2 wherein the electrically conductive substance comprises about 5% to about 25% by weight of the fibrous material in the slurry.

5. A method according to claim 1 wherein the fibrous material comprises about 60% to 90% by weight of the solids comprising the slurry.

6. A method according to claim 1 wherein the electroconductive polymer dispersant has cationic or anionic properties.

7. A method according to claim 6 wherein the polymer dispersant is a cationic amine-substituted polymethacrylate.

8. A method according to claim 6 wherein the polymer dispersant is an anionic alkali metal polyacrylate or lignosulfonate.

9. A method according to claim 1 wherein the retention aid polymer is an acrylamide or a copolymer of an acrylamide.

10. A method according to claim 1 wherein the polymer dispersant comprises about 5% to about 20% by weight of the conductive substance present in the slurry.

11. A method according to claim 1 wherein at least one additional conductive ply in sheet form is formed from said at least one aqueous slurry containing the particles of the conductive substance, said at least one additional conductive ply being incorporated into said multi-ply structure and providing a second substantially continuous, uninterrupted, electrostatic charge intercepting barrier therein, said additional conductive ply having electrostatic charge intercepting and dissipating properties substantially equal to those of said first mentioned conductive ply.

12. A method according to claim 11 wherein said additional conductive ply is positioned adjacent to said first mentioned conductive ply in the multi-ply structure.

13. A method according po claim 11 wherein said additional conductive ply is positioned in spaced relation with respect to said first mentioned conductive ply in the multi-ply structure.

* * * * *